United States Patent [19]
Conder

[11] Patent Number: 6,078,359
[45] Date of Patent: Jun. 20, 2000

[54] VACUUM COMPATIBLE MINIATURE CCD CAMERA HEAD

[75] Inventor: Alan D. Conder, Tracy, Calif.

[73] Assignee: The Regents of the University of California, Oakland, Calif.

[21] Appl. No.: 08/683,644

[22] Filed: Jul. 15, 1996

[51] Int. Cl.[7] .................................................. H04N 5/225
[52] U.S. Cl. ........................ 348/374; 348/375; 348/207; 361/715; 257/718
[58] Field of Search ..................................... 348/207, 241, 348/243, 244, 294, 311, 373, 374, 375; 361/704, 707, 711, 715, 719, 720, 721, 760; 257/718, 719, 720, 726, 727, 796; 165/80.3, 80.2; 174/16.3; H04N 5/335

[56] References Cited

U.S. PATENT DOCUMENTS

| | | | |
|---|---|---|---|
| 4,379,232 | 4/1983 | Hopper | 250/332 |
| 4,916,575 | 4/1990 | Van Asten | 361/715 |
| 5,221,964 | 6/1993 | Chamberlain et al. | 348/373 |
| 5,233,426 | 8/1993 | Suzuki et al. | 348/373 |
| 5,583,749 | 12/1996 | Gochi et al. | 361/760 |

OTHER PUBLICATIONS

A.D. Conder et al., "Miniature, vacuum compatible 1024× 1024 charge–coupled device camera for x–ray, ultraviolet, or optical imaging", Rev. Sci. Instrum. 66(1) Jan. 1995.

*Primary Examiner*—Tuan Ho
*Attorney, Agent, or Firm*—L. E. Carnahan

[57] ABSTRACT

A charge-coupled device (CCD) camera head which can replace film for digital imaging of visible light, ultraviolet radiation, and soft to penetrating x-rays, such as within a target chamber where laser produced plasmas are studied. The camera head is small, capable of operating both in and out of a vacuum environment, and is versatile. The CCD camera head uses PC boards with an internal heat sink connected to the chassis for heat dissipation, which allows for close(0.04" for example) stacking of the PC boards. Integration of this CCD camera head into existing instrumentation provides a substantial enhancement of diagnostic capabilities for studying high energy density plasmas, for a variety of military industrial, and medical imaging applications.

11 Claims, 8 Drawing Sheets

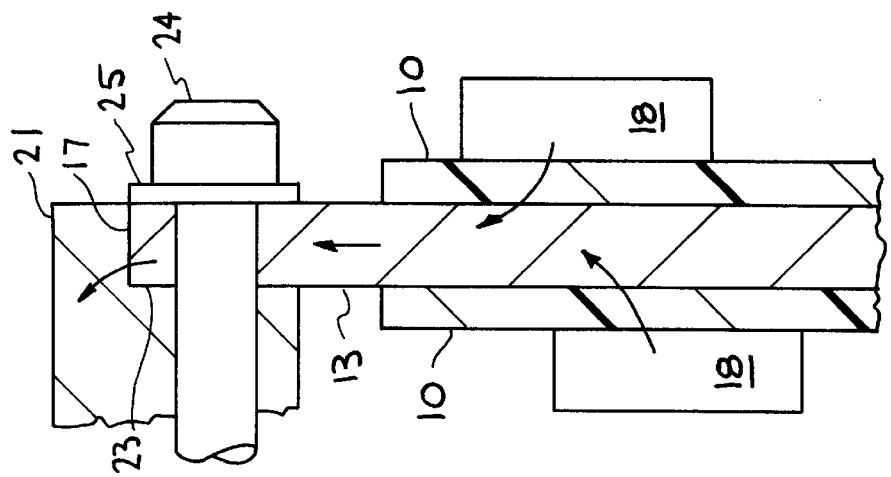
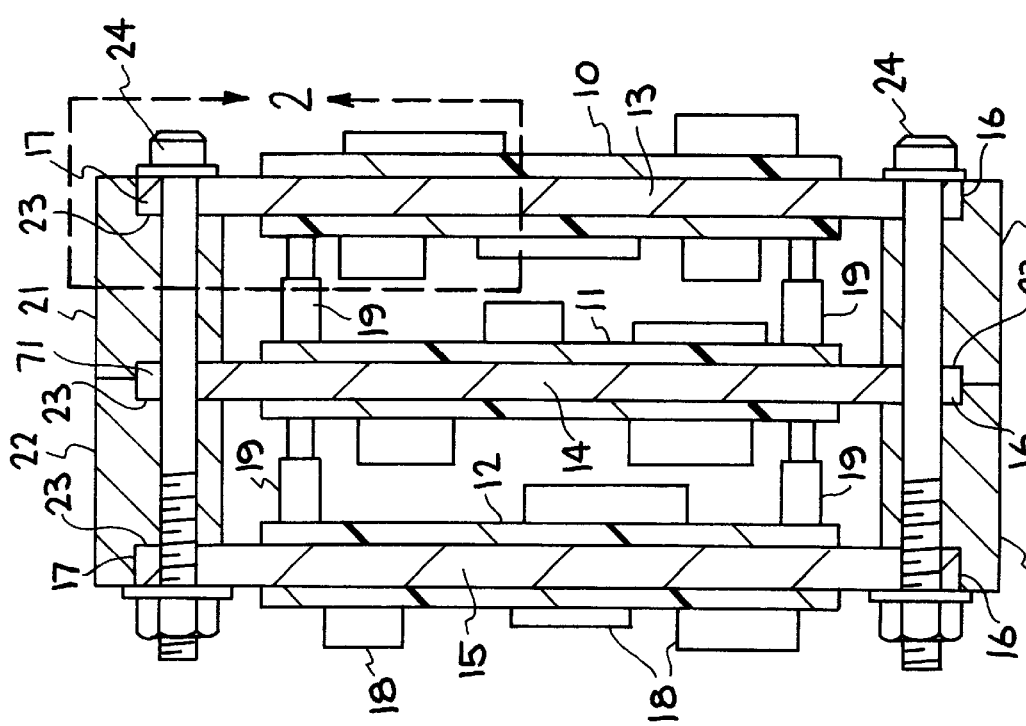

6,078,359

VACUUM COMPATIBLE MINIATURE CCD CAMERA HEAD

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to imaging devices, particularly to imaging of visible light, ultraviolet radiation, and soft to penetrating x-rays, a more particular to a charge-coupled device (CCD) camera head for such imaging wherein the camera head is small, capable of operating in and out of a vacuum environment, and is versatile.

Cameras of various types have been used for imaging of visible light, ultraviolet radiation, and soft to penetrating x-rays within a target chamber where laser produced plasma images are studied. This imaging, in general, has been carried out using film, which can be damaged, particularly involving high energy density plasmas, such as generated by pulse-power, ICF, and other high powered laser-plasma interaction studies. In many of these studies the imaging apparatus must be located with a target or reaction chamber and thus must be capable of withstanding harsh environments, and well as being capable of operating in and out of a vacuum environment.

The present invention provides a charge-coupled device (CCD) camera head which can replace film for the above-identified imaging applications. The camera head is small, capable of operating both in and out of a vacuum environment, and is versatile. This is accomplished by utilizing printed circuit (PC) boards having an internal heat sink which are secured to the camera chassis to form a thermally conductive path out of the camera, and enable close stacking of the PC boards for miniaturization of the camera head.

SUMMARY OF THE INVENTION

An object of the present invention is to provide a charge-coupled device (CCD) camera head.

A further object of the invention is to provide a vacuum compatible CCD camera head.

A further object of the invention is to provide a miniature CCD camera head capable of operating both in and out of a vacuum environment.

Another object of the invention is to provide a CCD camera head for digital imaging of visible light, ultraviolet radiation, and soft to penetrating x-rays.

Another object of the invention is to provide a miniature CCD camera head for high energy density plasmas studies.

Another object of the invention is to provide a miniature CCD camera head for imaging applications and which is capable of withstanding hard environmental conditions, such as high powered laser-plasma interactions.

Another object of the invention is to provide a miniature CCD camera head capable of dissipating the heat generated by the electronics therein, while enabling close stacking of the electronic components.

Another object of the invention is to provide a miniature CCD camera head which utilizes PC boards having internal heat sinks which are connected to the camera chassis to form a thermally conductive path out of the camera head to the camera chassis where the heat can be removed using conventional methods.

Another object of the invention is to provide a CCD camera head using closely stacked PC boards which include an integral heat sink having edges or end extending beyond the PC board for connection to the camera chassis.

Another object of the invention is to provide a CCD camera head using PC boards with internal heat sinks and a heat sink/PC board forming a vacuum barrier, and which utilizes a thermal electric cooler, and a direct connection between the PC board assembly and a heat sink located in the camera chassis.

Other objects and advantages of the present invention will become apparent from the following description and accompanying drawings. Basically, the invention is a vacuum compatible miniature charge-coupled device (CCD) camera head. By the use of printed circuit (PC) boards having an integral heat sink, the PC boards can be closely stacked, whereby the electronic components or elements between the opposing PC boards are within 0.04–0.25 inch of each other, thus allowing miniaturization of the camera head. The camera head also includes a thermal electric cooler to enable the CCD to cool to −40° C. or less and provides for a vacuum barrier while allowing the electrical signals are brought through cutouts in the heat sink and passed to the CCD.

BRIEF DESCRIPTION OF THE DRAWINGS

The accompanying drawings, which are incorporated into and form a part of the disclosure, illustrate an embodiment of the invention and, together with the description, serve to explain the principles of the invention.

FIG. 1 illustrates an embodiment of a PC board arrangement in accordance with the present invention, wherein each PC board has an integral internal heat sink which is connected to the chassis of the camera.

FIG. 2 is an enlarged partial cross-sectional view of a portion of a PC board of FIG. 1, as indicated at 2, illustrating the heat flow therein.

DETAILED DESCRIPTION OF THE INVENTION

Figure 3:
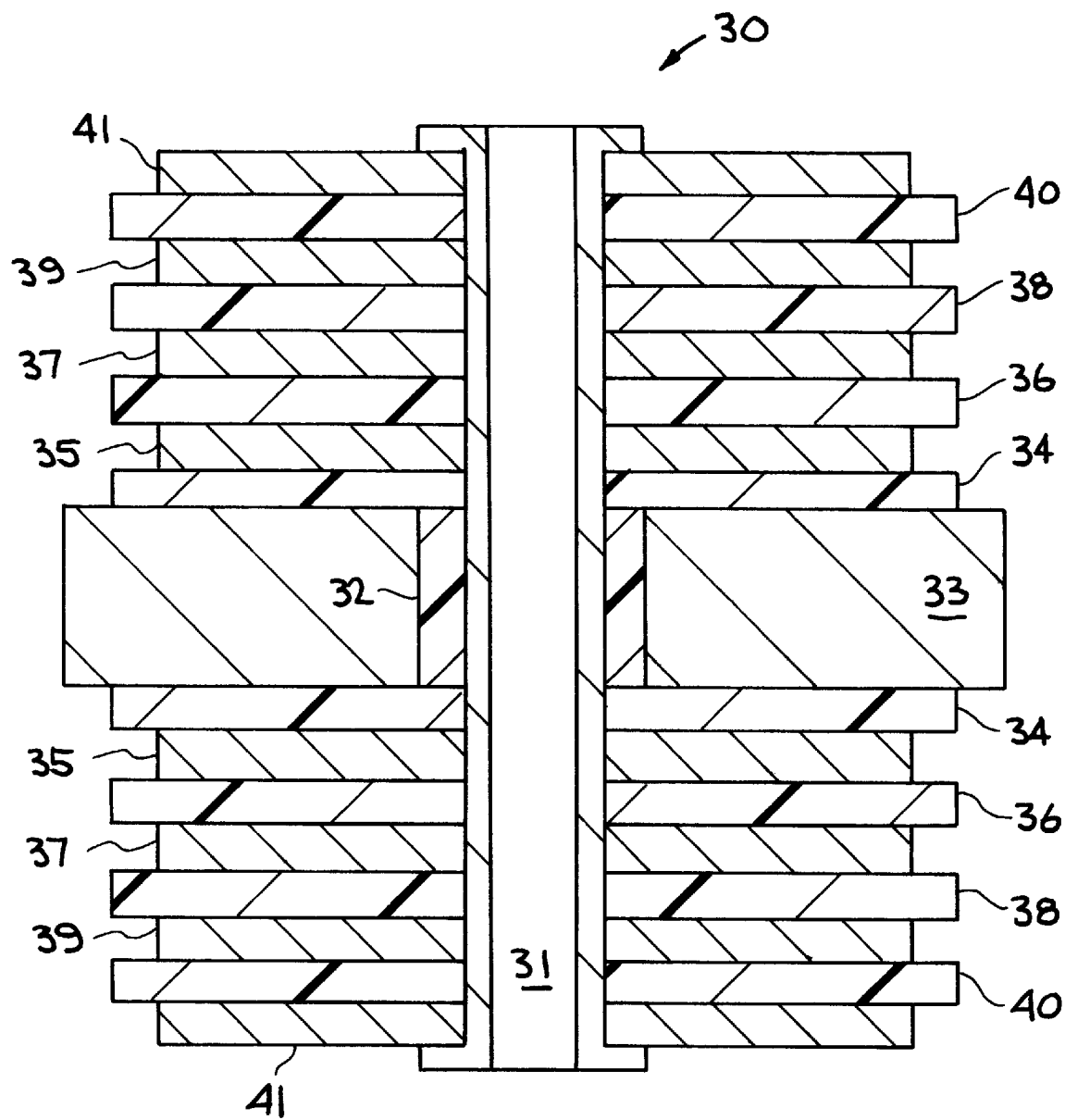
FIG. 3 is a partial cross-sectional view of an embodiment of stacked PC boards using the integral heat sink arrangement in accordance with the invention.

The present invention is a compact, large active area, high spatial resolution, high dynamic range, charge-coupled device (CCD) camera used to replace film for digital imaging of visible light, ultraviolet radiation, and soft to penetrating x-rays. Integration of such a CCD camera to existing instrumentation provides a substantial enhancement of diagnostic capabilities for studying high energy density plasma, such as generated by pulse-power, inertial confinement fusion (ICF), and other high powered laser systems. Laser-plasma interaction studies will have applications in a variety of defense, energy, industrial, and medical imaging arenas.

Many of these applications require the CCD camera to be located within a vacuum chamber and often very close to the actual target or source, and such imposes very tight size and vacuum compatibility restrictions on the CCD camera. The CCD camera has a high level of flexibility, can use CCD chips of various types, with various CCD formats, and sensitivities to a wide range of radiation, as referenced above, as well as charged particles. The CCD camera will operate both in vacuum and at standard atmospheric pressure. Digital output from the camera can be accessed by a wide range of computer platforms and image processing software packages. The CCD camera utilizes several major elements that together provide the utility for use in many applications. The major elements or components of this invention include: 1) printed circuit (PC boards with built in heat sinks, and 2) heat sink/PC board forming a vacuum barrier. In addition, the CCD camera may utilize: 1) a vacuum pump-down port, and 2) a camera chassis assembly which incorporated donut or ring configured members for retaining the PC boards. Each of the four (4) above-referenced major components or elements of an embodiment of the CCD camera will be described separately hereinafter.

1. PC Board With Built in Heat Sink

The camera head housing must be capable of dissipating the heat generated by the electronics within the package. Within a vacuum environment there can be no convective cooling, and the size constraint on the camera head eliminates the possibility of radiative cooling, and thus only conductive cooling can be employed to remove excess heat from the camera electronics. FIGS. 1 and 2 illustrate a unique PC board and chassis construction which provides a method to remove this heat from the camera electronics, while at the same time maintaining a small volume, and increasing the overall structural strength of the package.

Referring now to FIGS. 1 and 2, with FIG. 2 being an enlargement of the section 2 of FIG. 1, the camera head is composed of a plurality of PC boards (three shown for simplicity), indicated at 10, 11 and 12, and which are provided with internal integral heat conductive cores, members or heat sinks, constructed for example of copper, indicated at 13, 14 and 15, each having edges or ends 16 and 17 which extend beyond the PC boards 10, 11 and 12. The PC boards 10–12 are provided with electronic components indicated at 18 and the PC boards 10–12 are separated by spacers or insulator members 19. The edges or ends 16 and 17 of the cores or heat sinks 13, 14 and 15 are bolted or otherwise secured in a camera chassis generally indicated at 20 and which may be composed of heat conductive ring sections 21 and 22. In this embodiment, the edges or ends 16 and 17 are secured in grooves or cut-away sections 23 of the chassis 20 by screws 24, as shown in FIG. 2, via a washer 25, and which may extend through the ring sections 21–22 of chassis 20. The screws 24 and washer 25 are constructed of a heat conductive material. Thus, as shown in FIGS. 1 and 2, each PC board has an integral internal heat sink that is secured to the chassis and which forms a thermally conductive path from the electronic components out of the camera head to the camera chassis, as shown by the arrows in FIG. 2, where the heat can be removed using conventional methods. The internal members or heat sinks 13–15 may be in addition to copper constructed of Ag; with the chassis rings 21 and 22 constructed of Al, Cu, Ag, or brass, and the screws 24 constructed of brass, such that maximum heat dissipation from the electronic components 18 can be obtained. The PC board material may be composed of polyimide or fiberglass, as known in the art. By the edges or ends 16 and 17 extending beyond the PC boards, such enables easy and direct securing of the internal heat sinks 13–15 to the camera chassis 20, adding strength to the overall package.

As shown in FIG. 1, the PC boards are stacked, forcing the electronic components between adjacent PC boards to be closely located, for example with 0.04 inch of each other. This is done to reduce the size of the overall package. Thus, conventional heat sinks that sit on the electronic components themselves will not fit in this small space between components. Even conforming liquid heat sinks require too much space. FIG. 3 illustrates a cut-away view of an embodiment of a stacked PC board using an internal integral core or heat sink whose edges extend beyond the PC material, as in the FIGS. 1 and 2 embodiment.

As shown in FIG. 3, the embodiment of a stacked PC board, generally indicated at 30 includes a plated-thru hole or member 31, having at the center thereof a layer of insulating material 32 extending around the member 31, with a conductive metal core or heat sink 33, of 100% soft copper for example, or Al or Ag, extending around the insulating material 32, and which forms the center of the PC board 30. Secured to the core 33 on opposite sides are layers 34 of prepeg material, to which are secured layers 35 of a conductive metal, layers 36 of a double sided laminate, layers 37 of a conductive metal, layers 38 of prepeg, layers 39 of a conductive metal, layers 40 of a double sided laminate, and outer layers or foils 41. Note that the edge of the core 33 extends beyond the layers 34–41. The layers 35, 37, 39 and 41 may, for example be composed of 1 oz. copper, the layers 34 and 38 of prepeg material may be composed of polyimide or fiberglass, with the double sided laminate layers 36 and 40 being composed of polyimide or fiberglass, and the insulating material 32 composed of epoxy rosin, with the plated-thru hole 31 being formed by materials such as copper. Note that the PC board of FIG. 3 is a cut-away view of any configuration with heat sink 33 centrally located.

By incorporating a conductive metal core in a stacked PC board, whose edge extends beyond the PC material, not only forms a heat sink that is an integral part of the PC board, but also enables securing same to the camera chassis, which results in the PC board and chassis becoming a single structural element, thereby adding strength to the PC board and chassis, while enabling a thermally conductive material path out of the PC board to the camera chassis, where the heat can be removed using conventional methods.

Other applications for this type of PC board include avionics where power dissipation, compact size, and mechanical ruggedness are required; as well as the generation computers, i.e., Pentium class computers, that require large quantities of heat to be transferred to the chassis or heat exchanger.

2. Heat Sink/PC Board Forming a Vacuum Barrier

To obtain high quality images from the CCD within the camera head it is necessary to cool the CCD to −40° C. or less. This requires that a thermal electric (TE) cooler be installed in the camera head. Unfortunately, up to 30 W of exhaust heat is dissipated from these devices when cooling the CCD. This heat must be transferred to the camera chassis to avoid overheating the camera head.

Figure 5:
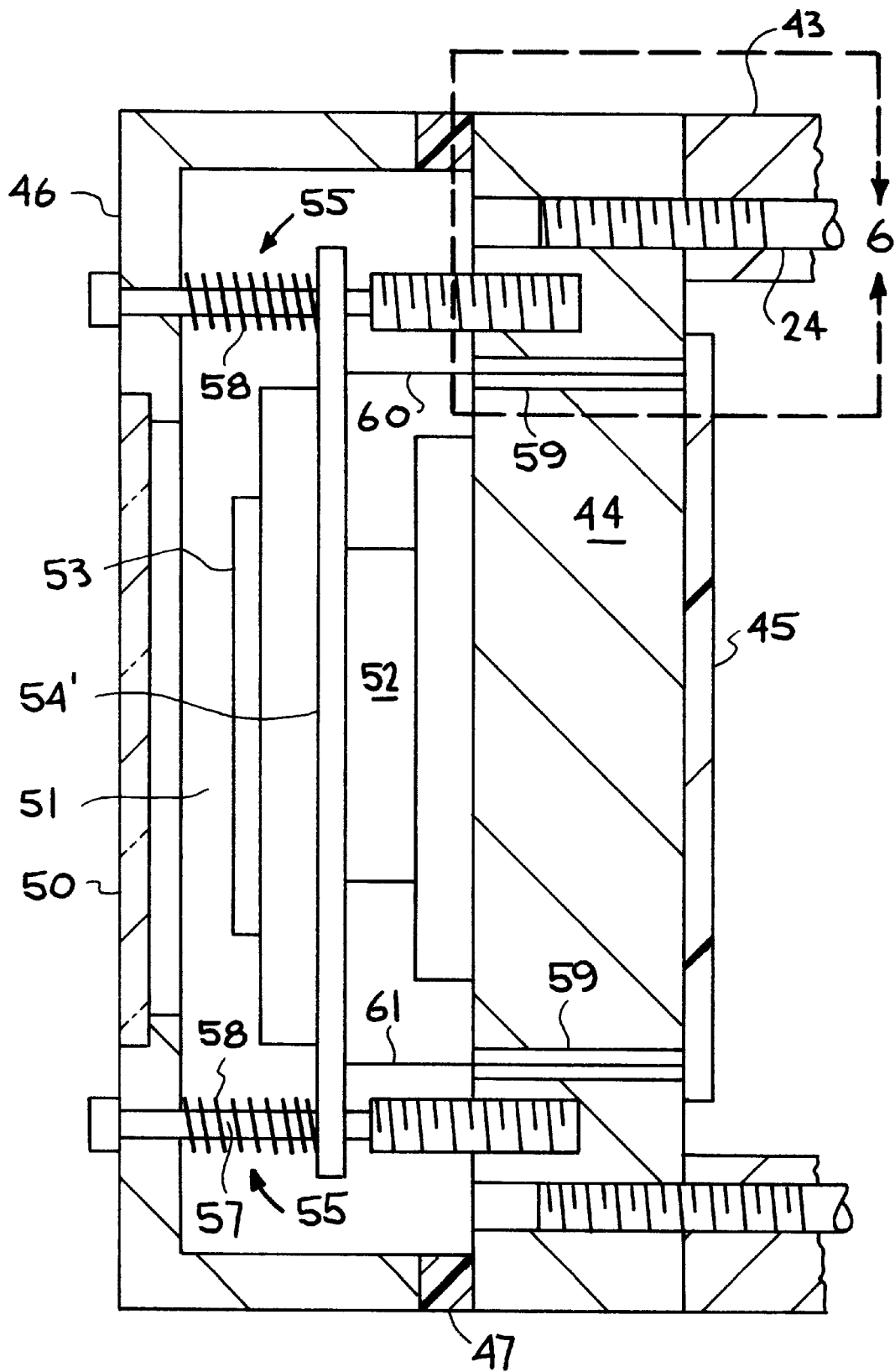
Figure 6:
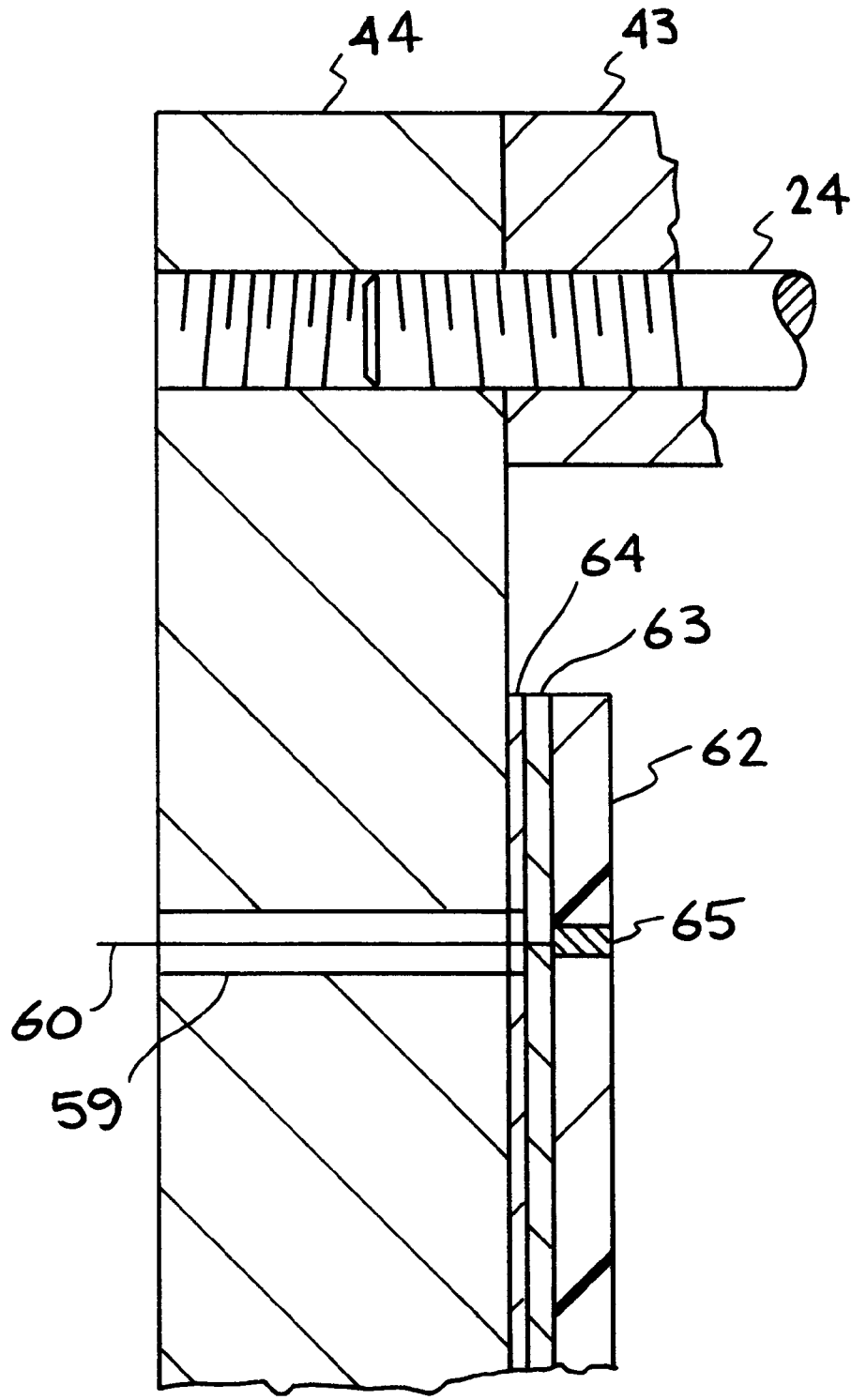

In many applications the CCD camera will be used in standard atmosphere. If the CCD is not surrounded by a vacuum, then at −40° C. water could condense onto the CCD and damage it. To avoid this the CCD must be maintained within a vacuum environment. At the same time, the CCD requires and generates electrical signals that must pass out into the associated equipment. The present invention removes the heat from the TE cooling element, provides for a vacuum barrier at the CCD while allowing the electrical signals to pass through, adds structural strength to the camera head, and offers all this in a small volume, as shown in FIGS. 4–6, with FIG. 6 illustrated as an enlargement of section 6 of FIG. 5.

Figure 4:
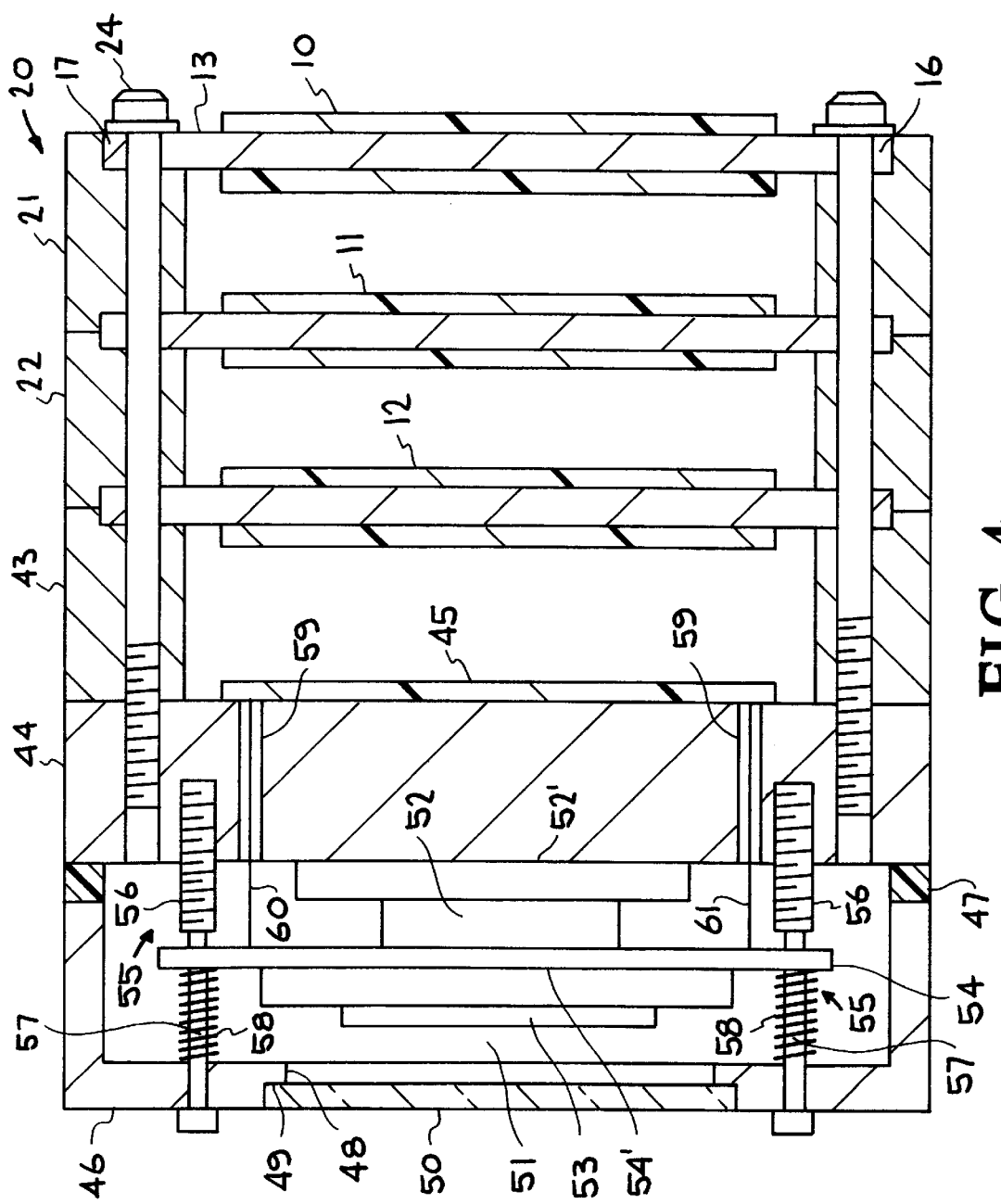
FIGS. 4, 5 and 6 illustrate an embodiment of a heat sink/PC board forming a vacuum barrier in accordance with the invention, with FIG. 6 being an enlargement of a portion of FIG. 5, as indicated at 6.

As shown in FIG. 4, which incorporates the PC boards 10, 11 and 12 and the camera chassis 20 of FIG. 1 additionally includes an additional chassis ring 43, similar to chassis rings 21 and 22 of FIG. 1, and to which is connected a member or heat sink 44 as by screws 24 of FIG. 1, and on one side of which is directly mounted a PC board 45. A cap 46, constructed of material such as stainless steel, is secured to heat sink 44 via a gasket 47, such as rubber, and includes an opening 48 having a groove or cut-away edge 49 in which a transparent member 50, constructed for example, of glass or other material, depending on the application of the camera head. A CCD chamber 51 is defined by heat sink 44, cap 46 and member 50, within which is located a TE cooler 52 and a CCD 53, with the TE cooler 52 being secured as indicated at 52' to heat sink 44. CCD 53 is supported within chamber 51 via a support member or plate 54 which is secured in chamber 51 via a support member or plate 5 which is secured in chamber 51 via connected members 55, such as bolts or screws (only two shown), which extend through cap 46 into heat sink or member 44, screws or bolts 55 include a threaded section 56 and a smooth smaller diameter section 57, with support member or plate 54 being retained by springs 58 at the point of intersection of sections 56 and 57 of bolts 55. While not shown, the CCD 53 is secured to or integral with support plate 54, as indicated at 54'. The member or heat sink 44 is provided with a plurality off cutouts or openings 59 (only two shown) through which electrical wiring 60 and 61 extend (see FIG. 6) and interconnects the plate 54 of CCD 53 with the PC board 45. As seen in FIG. 6, the PC board 45 includes a substrate 62 composed, for example, of polyimide, and a conductive layer 63, composed, for example, of copper, with the conductive layer 63 being secured to member or heat sink 44 via a solder layer 64, and the electrical wire 60 is secured in substrate 62 and in conductive layer 63 via a solder joint 65.

The heat from the TE cooler 52 passes directly into the member or heat sink 44, which may be constructed of copper, Ag, Au, or Al, and out to the camera chassis 20. The CCD chamber 51 can be evacuated to provide a vacuum for the CCD 53, and the PC board 45 where the electrical wires 60 and 61 are soldered to the PC board to form a vacuum tight barrier. The electrical signals generated in the PC boards are brought out through the cutouts 59 in the heat sink 44 and passed to the CCD. The solder 64 at the PC board to heat sink interface and at the electrical wire to PC board interface form a vacuum tight seal.

Standard electrical/vacuum feedthrus are too large to be used in this small camera head and the concept of soldering the PC board 45 directly to the heat sink/vacuum barrier to form a vacuum seal is a unique approach.

3. Vacuum Pump-Down Port

Figure 7A:
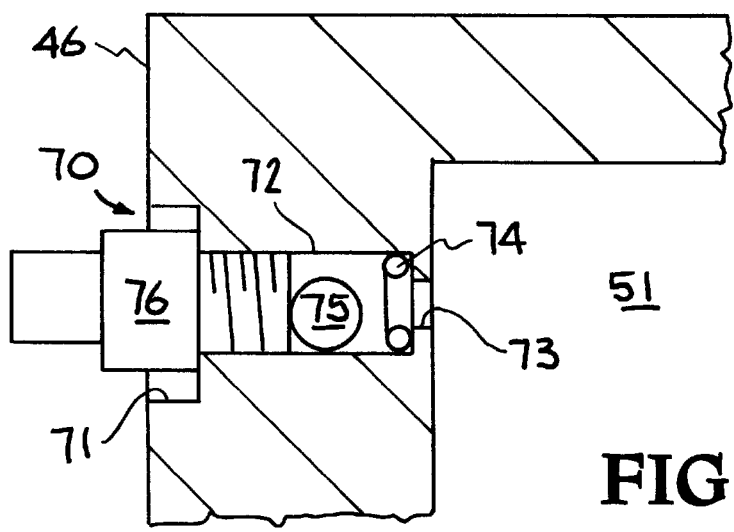
FIGS. 7A, 7B and 7C illustrate an embodiment of a vacuum pump-down port arrangement that may be incorporated into the CCD camera head.
Figure 7B:
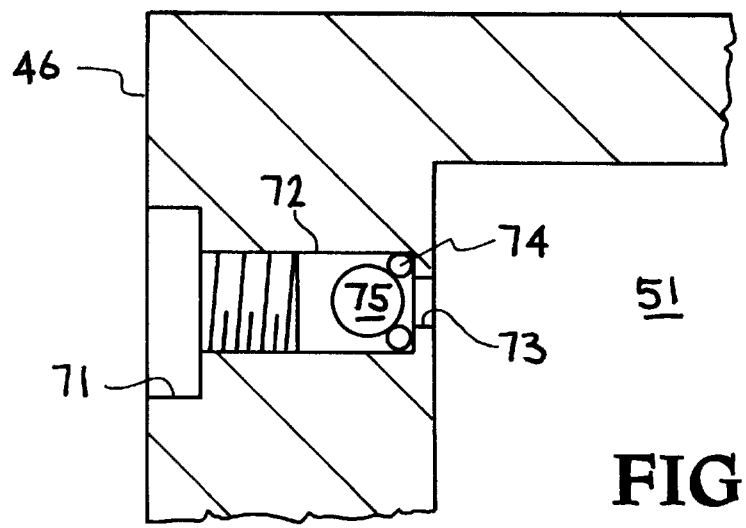
Figure 7C:
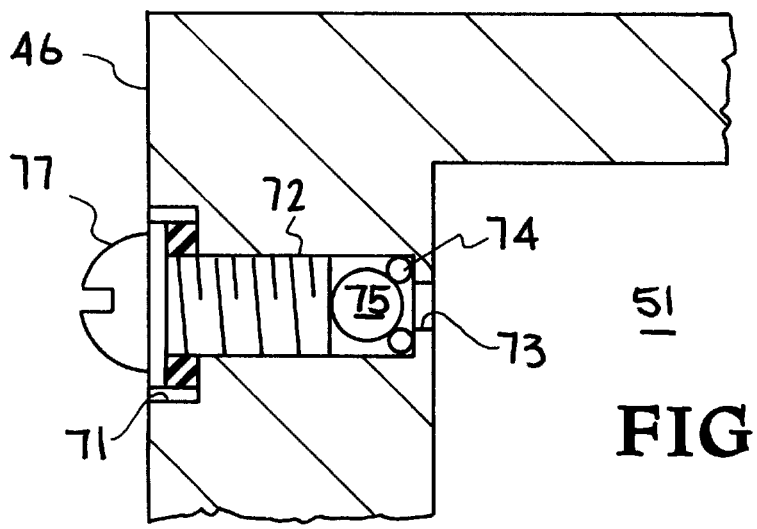

In order to use the CCD camera in standard atmosphere, the CCD chamber of the head shown in FIG. 4 has to be evacuated, for reasons set forth above. This may be done using a vacuum pump-down port. Unfortunately, standard pump-down port arrangements are too bulky for this small camera head, and thus a very small ball-valve and gasketed screw arrangement in the cap 46 that surrounds the CCD chamber of FIG. 4 has been developed, as illustrated in FIGS. 7A, 7B, and 7C. Basically, the cap 46 is provided with an opening 70 of different diameter sections 71, 72, and 73, with section 72 being threaded. A O-ring 74, for example, is secured at the opening section 72-73 interface. A small ball 75 is positioned in opening section 72. During pump-down of CCD chamber 51 a removably pump-down valve stem 76 is threadly secured in threaded section 72 of opening 70, as shown in FIG. 7A. During pump-down the ball 75 moves away from O-ring 74 allowing air to pass from the chamber 51 through valve stem 76, as indicated by the arrow in FIG. 7A. When the chamber 51 is evacuated, the valve stem 76 is removed and exterior air pressure forces the ball 75 against the O-ring 74, sealing off the opening 70, as shown in FIG. 7B. To assure that the chamber 51 remains at the desired vacuum, a gasketed screw 77 is then inserted into the threaded section 72 of opening 70 to hold the ball 75 in place against O-ring 74, as shown in FIG. 7C. A separate gasketed screw, not shown, mounted in cap 46 can be loosened to allow air back into the chamber 51. A miniature pump-down port arrangement, such as illustrated in FIGS. 7A–7C, greatly enhances the utility of the CCD camera by allowing it to remain very compact while providing vacuum pump-down capability. Other types of pump-down arrangement may be effectively utilized to obtain and retain a vacuum condition within the CCD chamber of the camera head.

Figure 8:
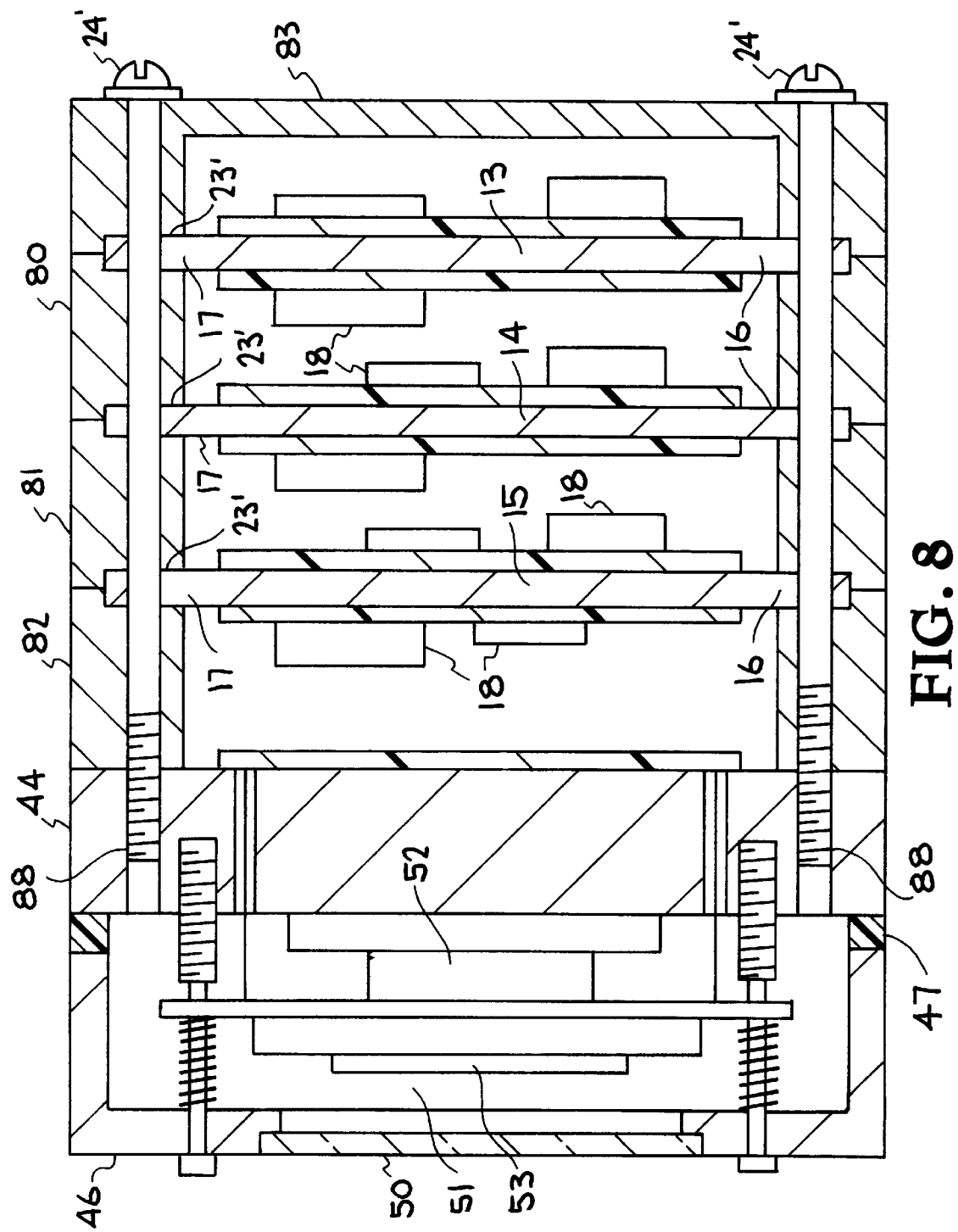
FIGS. 8 and 9 illustrate an embodiment of a chassis for retaining the PC boards, whereby the internal core on heat sink of each PC board is connected to camera chassis to provide the needed heat transfer.
Figure 9:
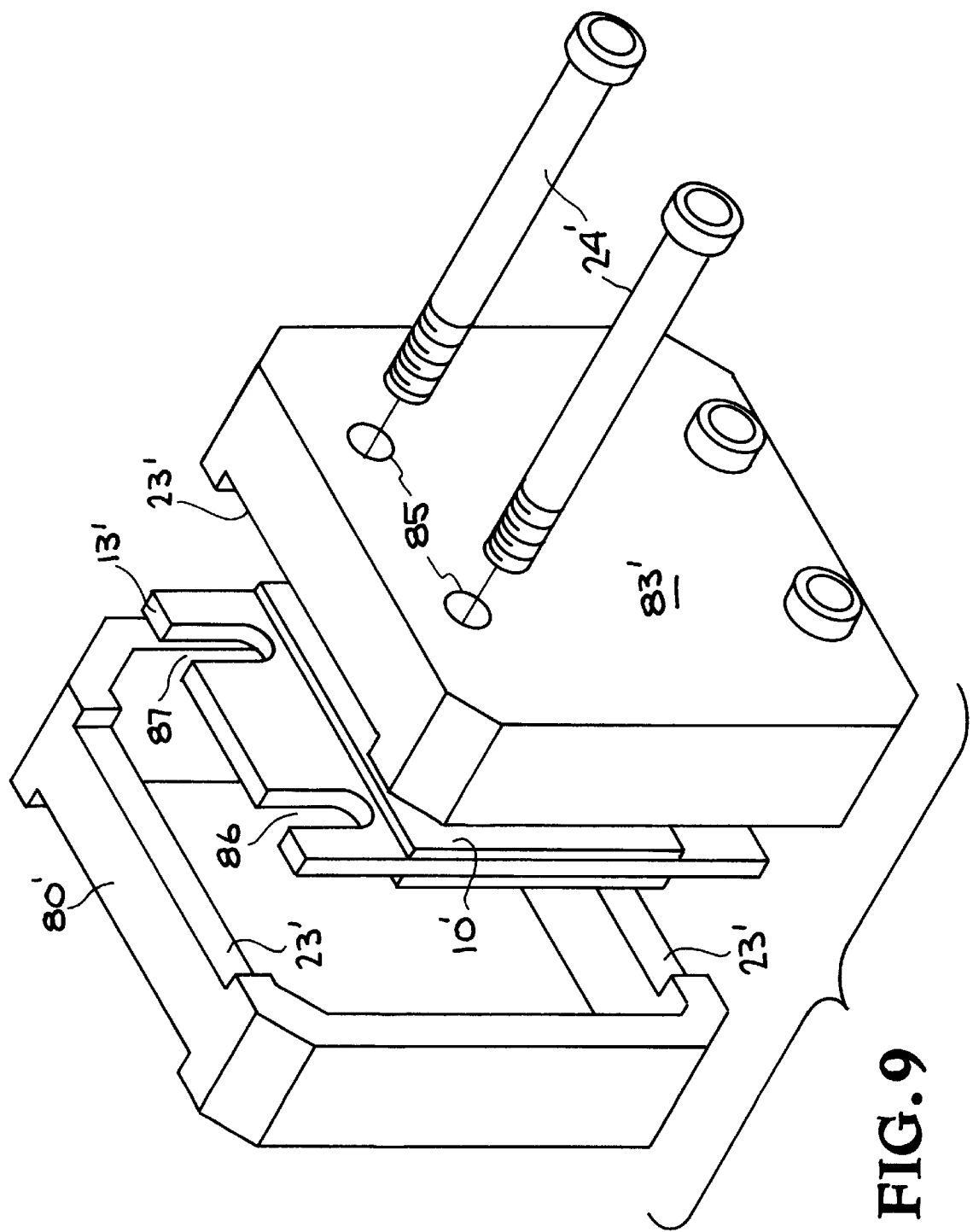

The camera head chassis, as illustrated in FIGS. 1, 7, 8 and 9 may be made up of a series of ring members or "donuts" that can be clamped together, as described above with respect to FIG. 1. FIG. 8 illustrates a CCD camera head generally similar to FIG. 7, but additionally includes an end cap or cover member, whereby the PC boards are enclosed. The arrangement of the chassis 20 as shown in FIG. 8 is unique in that the ring members or "donuts" 80, 81 and 82, together with an end cap or member 83, form a tight press fill against the ends 16 and 17 of the internal cores or heat sinks 13, 14 and 15 which extend from the ends of PC boards 10, 11 and 12, as described above with respect to FIGS. 1 and 2. The end cover 83 and ring members 80, 81 and 82 are tightly secured together and to member or heat sink 44 by screws 24', as seen in FIG. 8, whereby the ends 16 and 17 of internal heat sinks 13–15 secured in cut-aways 23', and produces a thermal path for the heat to escape from within the camera head. To remove the heat from the camera chassis 20, a conventional heat exchanger arrangement may be used.

The chassis 20 is designed to be placed in a vacuum where outgasing from the camera head can be a problem. The chassis assembly illustrated in either FIG. 8 or FIG. 9 is not air tight and has been purposely designed to allow air to pass through the chassis. This will speed up the pump-down rate in the vacuum chamber and not cause the camera head to appear as a virtual leak. The "donut" shape of the chassis rings is more evident from FIG. 9 where a ring member 80' and an end cover 83' secure a PC board 10' therebetween, such that the integral internal core 13' of PC board 10' is secured in cut-aways 23' in the members 80' and 83', when the members are 83' and 80' are secured together via screws 24' which pass through openings 85 in cover member 83' (four openings 85 shown) and through cut-aways 86 and 87 in PC board 10' and heat sink 13', and terminate in threaded openings 88 in heat sink 44, as shown in FIG. 8. Note that the screws 24' extend within the outer walls of the ring members 80, 81, and 82 of FIG. 8, and not openings in members 80–82, as more readily seen in FIG. 9.

The "donut" or ring member assembly of the chassis will accept production tolerances in the manufacture of the thermal core or internal heat sink of the PC boards, allowing good thermal contact between the PC board and the chassis, while additionally providing strength to the overall package due to the interconnection of adjacent "donuts".

It has thus been shown that the present invention provides a vacuum compatible miniature CCD camera head. By the use of PC boards with integral internal heat sinks which have ends or edges extending from the PC material and secured in the chassis, good thermal conduction from the electronic components of the PC boards to the chassis is provided, thereby the size of the camera head can be reduced and has sufficient cooling thereof. By providing the camera head with a vacuum chamber, the camera can be used in either vacuum or atmosphere environments.

While particular embodiments, materials, and parameters have been set forth to exemplify and describe the principles of the invention, such are not intended to be limiting. Modifications and changes may become apparent to those skilled in the art, and it is intended that the invention be limited only by the scope of the appended claims.

The invention claimed is:

1. A charge-coupled device (CCD) camera, including:
   a chassis including a plurality of ring members having cut-aways located at an interface of adjacent ring members,
   a plurality of printed circuit boards,
      each of said printed circuit boards having an internal heat sink having sections which extend from the printed circuit,
         said sections of said heat sinks being secured to said cut-aways of said ring members of said chassis,
      whereby heat generated by said printed circuit boards is dissipated via said internal heat sinks to said chassis.

2. The camera of claim 1, wherein said printed circuit boards are stacked in a compact arrangement such that electronic components thereon are positioned less than 0.1 inch from each other.

3. The camera of claim 1, wherein said printed circuit boards are of a multiple layer construction around said internal heat sink, and including alternating layers of a conductive material.

4. The camera of claim 1, additionally including means forming a vacuum barrier secured to said chassis.

5. The camera of claim 1, wherein said vacuum barrier includes a heat sink secured to said chassis, a cap secured to said heat sink and provided with an opening, a transparent member being positioned in said opening, said heat sink, cap, and transparent member defining a chamber, and means for evacuating said chamber.

6. The camera of claim 1, additionally including a charge-coupled device and a thermal electric cooler positioned in said chamber, and a printed circuit board secured to a side of said heat sink opposite said chamber, and means for electrically connecting said printed circuit board secured to said heat sink to said charge-coupled device in said chamber.

7. The camera of claim 6, wherein said means for electrically connecting said printed circuit board to said charge-coupled device comprises a plurality of wires which extend through openings in said heat sink, and each wire being secured at one end to said printed circuit board and at an opposite end said charge-coupled device.

8. The camera of claim 7, wherein said printed circuit board is secured to said heat sink by solder, and said wires are secured at least to said printed circuit board by solder, thereby preventing a vacuum leak from said chamber.

9. A vacuum compatible miniature charge-coupled device (CCD) camera head, including:
   a chassis including a plurality of ring members having cut-aways therein,
   a plurality of printed circuit boards positioned within said chassis, each having an internal heat sink connected to ring member cut-aways of said chassis, and
   a vacuum barrier assembly connected to said chassis and including:
      a heat sink,
      a printed circuit board secured directly to said heat sink,
      a cap secured to said heat sink forming a chamber,
      a cooler assembly positioned in said chamber,
      a charge-coupled device positioned in said chamber,
         and means for electrically connecting said printed circuit board to said charge-coupled device.

10. The camera head of claim 9, wherein said means comprises a plurality of wires extending through said heat sink, and having opposite ends connected to said printed circuit board and said charge-coupled device.

11. The camera head of claim 9, additionally including a transparent member located in said cap.

* * * * *